(12) United States Patent
Motoyama et al.

(10) Patent No.: US 9,776,202 B2
(45) Date of Patent: Oct. 3, 2017

(54) DRIVING METHOD OF VERTICAL HEAT TREATMENT APPARATUS, STORAGE MEDIUM AND VERTICAL HEAT TREATMENT APPARATUS

(71) Applicant: TOKYO ELECTRON LIMITED, Tokyo (JP)

(72) Inventors: Yutaka Motoyama, Oshu (JP); Keisuke Suzuki, Nirasaki (JP); Kohei Fukushima, Oshu (JP); Shingo Hishiya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 193 days.

(21) Appl. No.: 14/229,493

(22) Filed: Mar. 28, 2014

(65) Prior Publication Data

US 2014/0295082 A1   Oct. 2, 2014

(30) Foreign Application Priority Data

Mar. 29, 2013 (JP) ................................. 2013-074232

(51) Int. Cl.
*B05C 5/00* (2006.01)
*B05C 5/02* (2006.01)
(Continued)

(52) U.S. Cl.
CPC ............ *B05C 5/02* (2013.01); *C23C 16/4405* (2013.01); *C23C 16/4408* (2013.01); *H01L 21/67109* (2013.01); *H01L 21/67757* (2013.01)

(58) Field of Classification Search
CPC .................................................. C23C 16/4405
See application file for complete search history.

(56) References Cited

U.S. PATENT DOCUMENTS 7,416,978 B2 * 8/2008 Hasebe .................. C23C 16/52
257/E21.17
8,278,224 B1 * 10/2012 Mui ........................ C23C 16/44
118/715

(Continued)

FOREIGN PATENT DOCUMENTS

JP       2004-6801 A        1/2004
JP      2005-285922 A      10/2005
(Continued)

*Primary Examiner* — David Turocy
(74) *Attorney, Agent, or Firm* — Nath, Goldberg & Meyer; Jerald L. Meyer

(57) ABSTRACT

A driving method of a vertical heat treatment apparatus having a vertical reaction container with a heating part installed includes: performing a process of loading wafers by a substrate holder support to the reaction container; performing a film forming process of storing a first gas at a storage unit and pressurizing the first gas, and alternatively performing a step of supplying the first gas to the vacuum atmosphere reaction container and a step of supplying the second gas to the reaction container; subsequently performing a purge process of unloading the substrate holder support and supplying a purge gas into the reaction container to forcibly peel off a thin film attached to the reaction container; and while the purge process is performed, performing a process of repeating storing the purge gas at the storage unit, pressurizing the gas and discharging the gas into the reaction container.

2 Claims, 10 Drawing Sheets

(51) Int. Cl.
    *C23C 16/44*     (2006.01)
    *H01L 21/67*     (2006.01)
    *H01L 21/677*    (2006.01)

(56) References Cited

U.S. PATENT DOCUMENTS

| | | | | |
|---|---|---|---|---|
| 2007/0259532 A1* | 11/2007 | Suzaki | ............... | C23C 16/4401 438/758 |
| 2008/0268644 A1* | 10/2008 | Kameda | .............. | C23C 16/4405 438/694 |
| 2009/0004877 A1* | 1/2009 | Asai | .................... | C23C 16/4405 438/758 |
| 2009/0149032 A1* | 6/2009 | Kameda | .............. | C23C 16/4405 438/778 |
| 2010/0167541 A1* | 7/2010 | Kato | .................... | C23C 16/345 438/680 |
| 2013/0065402 A1* | 3/2013 | Kameda | ................... | B08B 9/08 438/758 |

FOREIGN PATENT DOCUMENTS

| | | |
|---|---|---|
| JP | 2006-237532 A | 9/2006 |
| JP | 2010-109387 A | 5/2010 |
| JP | 2010-171458 A | 8/2010 |
| JP | 2011-134748 | 7/2011 |
| JP | 2011-216906 A | 10/2011 |
| JP | 2012-114200 A | 6/2012 |
| TW | 201209916 A1 | 3/2012 |
| WO | 2005/029566 A1 | 3/2005 |

* cited by examiner

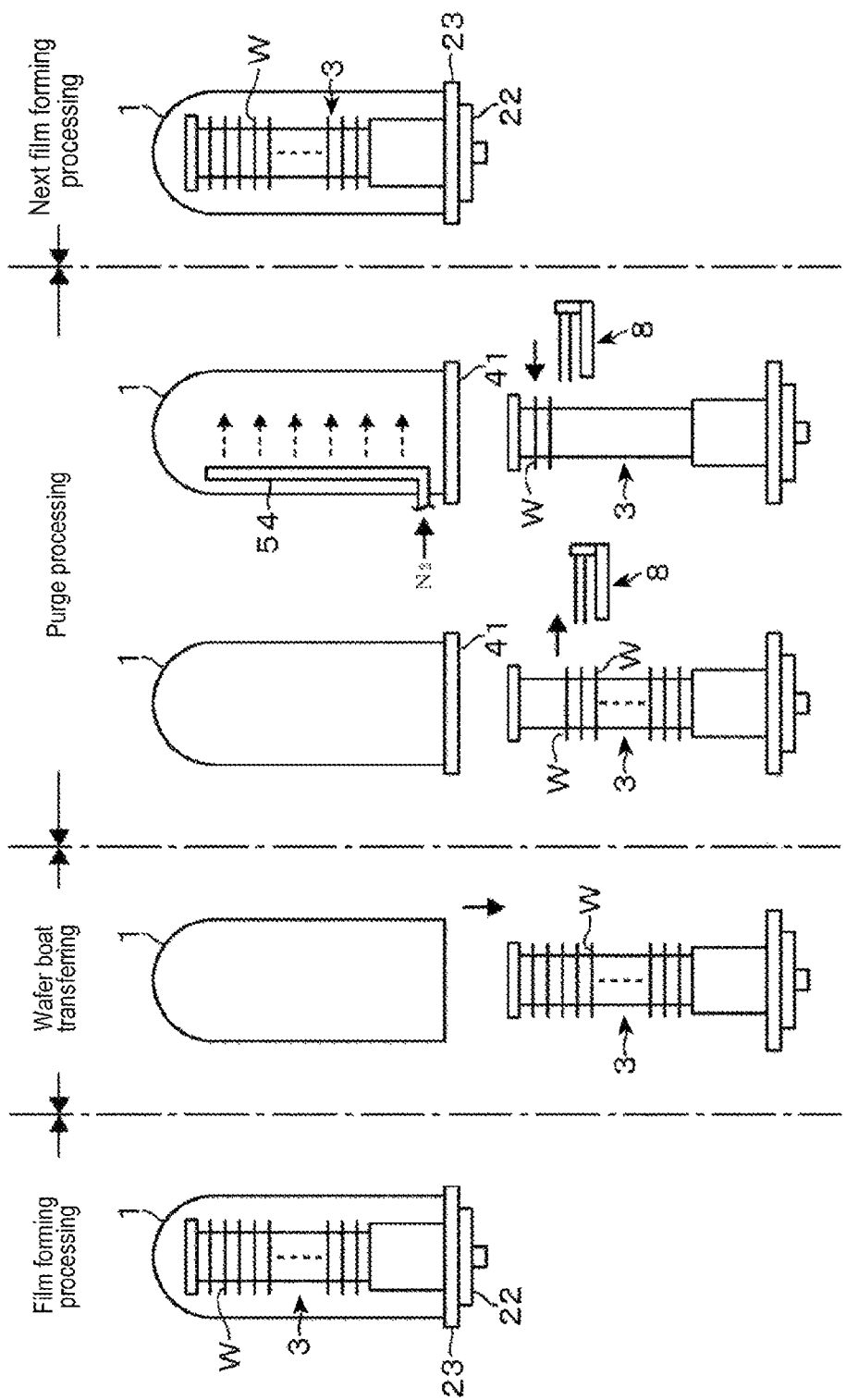

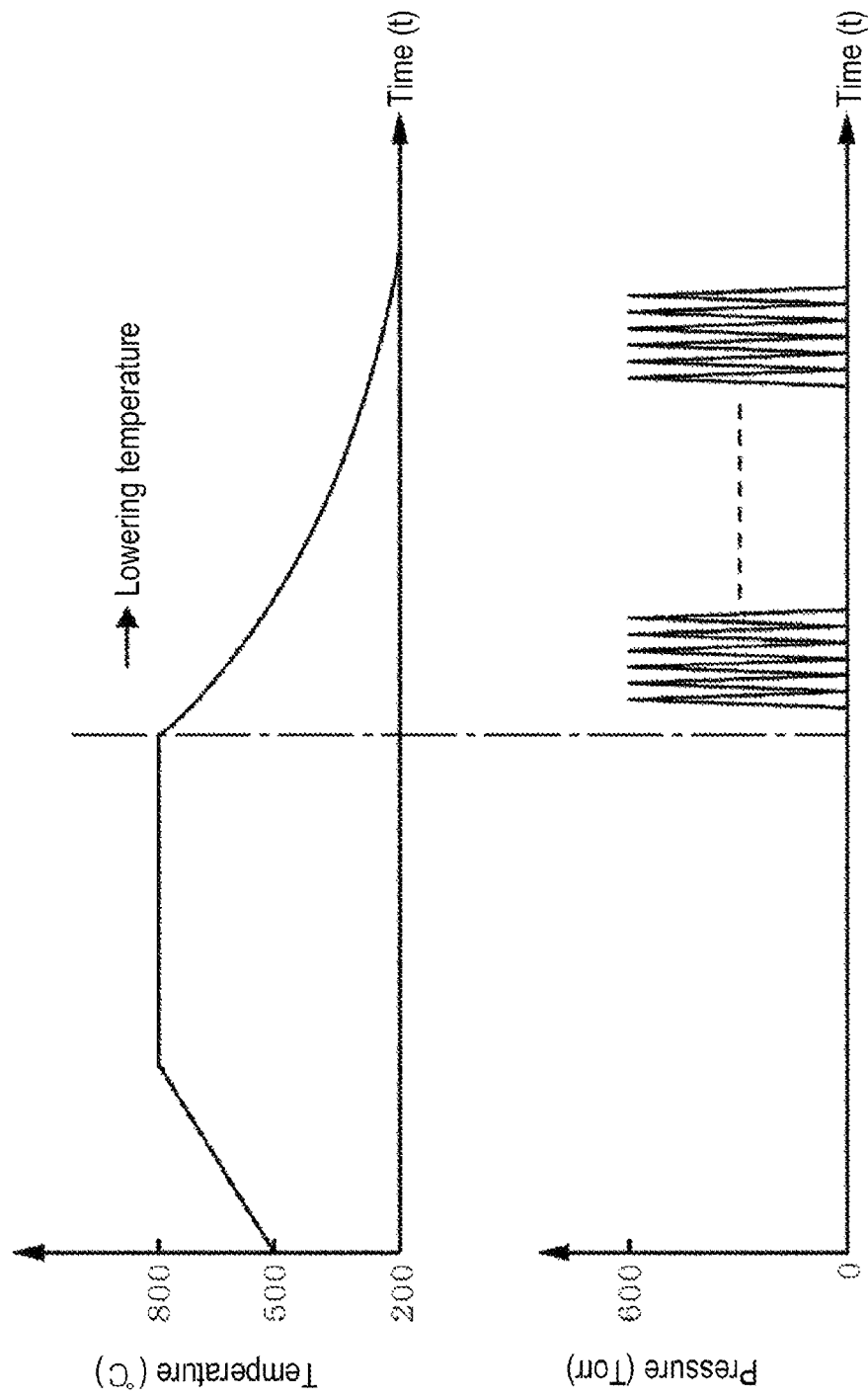

DRIVING METHOD OF VERTICAL HEAT TREATMENT APPARATUS, STORAGE MEDIUM AND VERTICAL HEAT TREATMENT APPARATUS

CROSS-REFERENCE TO RELATED APPLICATION

This application claims the benefit of Japanese Patent Application No. 2013-074232, filed on Mar. 29, 2013, in the Japan Patent Office, the disclosure of which is incorporated herein in its entirety by reference.

TECHNICAL FIELD

The present disclosure relates to a vertical heat treatment apparatus to perform a film forming treatment by holding a plurality of substrates with a substrate holder support, and a non-transitory storage medium to store a driving method for the apparatus and a program for driving the apparatus.

BACKGROUND

In manufacturing a semiconductor device, there are a number of methods to perform a film forming treatment for a semiconductor wafer (hereinafter, referred as a "wafer"). Among the above methods, there is provided a treatment in which atomic or molecular layers of reaction products are stacked to perform the film forming treatment. Such treatment provides satisfactory step coverage (a characteristic of deposition) for a minute-scaled pattern and a high precision for a thin film. The film forming treatment process includes making a first gas to be absorbed to the heated wafer, then reacting the molecules of the first gas on the wafer with a second gas, and nitrifying or oxidizing the above molecules, for example. The film forming treatment is carried out by repeating the above-mentioned process for a plurality number of times.

A vertical heat treatment apparatus is used for performing this film forming treatment for a plurality of wafers collectively. For instance, silane-based gas and ammonia gas are alternately supplied into a reaction container of the vertical heat treatment apparatus from their respective gas nozzles, thereby forming a silicon nitride film on the wafer. This film forming treatment may perform a method including: installing a buffer tank at each gas supply route, storing the gas in the buffer tank, pressurizing the gas, and discharging the gas at one burst. From this method, each gas can be supplied into the reaction container as fast as possible.

During the above method, the silicon nitride film may be peeled off from the reaction container, thereby generating particles. Thus, in order to restrain the generation of the particles from the peeled off silicon nitride film, a film forming treatment for the wafer, for example, is performed. After the treatment, a thermal stress is exerted to the film by varying the temperature within the reaction container by closing the cover of the reaction container at each time, thereby forcibly peeling the film off. Such treatment may retrain the particle from being generated. However, if a gas is supplied by using the buffer tank as mentioned above, particles tend to stick to the line in the direction of the diameter on the surface of the wafer. Considering the arrangement of the particles' line and gas nozzles, the particles are spurting out from a supply route for silane-based gas.

Conventionally, there is disclosed a method of storing a dichloro-silane gas in a gas storage unit, pressurizing the gas, and then supplying it into a processing container. Then, an inert gas is supplied into the processing container through the gas storage unit, wherein the inert gas is stored in the gas storage unit exclusively for an inert gas and installed at the upstream of the gas storage unit. However, this method is different from the invention of the present disclosure.

SUMMARY

The present disclosure provides to perform a step of pressurizing a raw gas at a storage unit by using a vertical heat treatment apparatus and supplying the gas to the substrate, and a step of supplying a reaction gas to the substrate alternately, in order to reduce particle pollution in performing a film forming treatment.

A driving method of a vertical heat treatment apparatus having a vertical reaction container with a heating part installed on the periphery of the vertical reaction container, a first gas nozzle configured to supply a first gas as a source gas, and a second gas nozzle configured to supply a second gas as a reaction gas which generates reaction products by reacting with molecules of the source gas, includes: performing a process of loading a plurality of wafers held in a shelf shape by a substrate holder support to the reaction container; performing a film forming process of storing the first gas at a storage unit installed at a gas supply route at an upper region of the first gas nozzle and pressurizing the first gas, and alternatively performing a step of supplying the first gas to the vacuum atmosphere reaction container by opening a valve at a lower region of the storage unit and a step of supplying the second gas to the reaction container from the second gas nozzle; subsequently performing a purge process of unloading the substrate holder support holding the substrate from the reaction container, closing a substrate carrying in/out hole of the reaction container, supplying a purge gas into the reaction container to forcibly peel off a thin film attached to the reaction container and changing a temperature of the reaction container; and performing a process, while the purge process is performed, of repeating an operation controlling the valve a plurality of times in storing the purge gas at the storage unit, pressurizing the gas and discharging the gas into the reaction container by opening a valve at a lower region of the storage unit, wherein the film forming process is performed after the process of repeating the operation controlling the valve a plurality of times to discharge the purge gas to the storage unit.

A non-transitory storage medium recording a computer program used for a vertical reaction container performing a heat treatment by loading a substrate holder support which holds a plurality of wafers to the vertical reaction container with a heating part installed on the periphery of the vertical reaction container, wherein the computer program has a step group configured to perform the aforementioned driving method of the vertical heat treatment apparatus.

A vertical heat treatment apparatus with a heating part installed on the periphery of the vertical reaction container loading a substrate holder support holding a plurality of substrates with a shelf shape, supplying a first gas as a source gas from a first gas nozzle and supplying a second gas as a reaction gas which generates reaction products by reacting with molecules of the source gas from a second gas nozzle, includes: a gas supply route configured to supply the first gas to the first gas nozzle; a storage unit installed at the gas supply route, an inside of the storage unit being pressurized by storing a gas; valves installed at the gas supply route at an upper and lower regions of the storage unit, respectively; a purge gas supply unit configured to supply a purge gas to the storage unit, wherein as a film forming step, an operation of controlling the valves is performed to repeat a step of supplying the first gas to the vacuum atmosphere reaction container by opening the valve at a lower region of the storage unit and a step of supplying the second gas into the reaction container from the second gas nozzle, alternatively; and a control part configured to subsequently unload a substrate holder support holding the substrate from the reaction container, close a substrate carrying in/out hole of the reaction container, store the purge gas at the storage unit and pressurize the gas in order to forcibly peel off the thin film attached to the reaction container, and then performing the purge step repeating a control of the valve for a plurality of times in order to discharge the purge gas to the reaction container from the storage unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a process diagram explaining a driving method of a vertical heat treatment apparatus.

FIG. 6 is a characteristic view explaining a fudge process performed at a vertical heat treatment apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
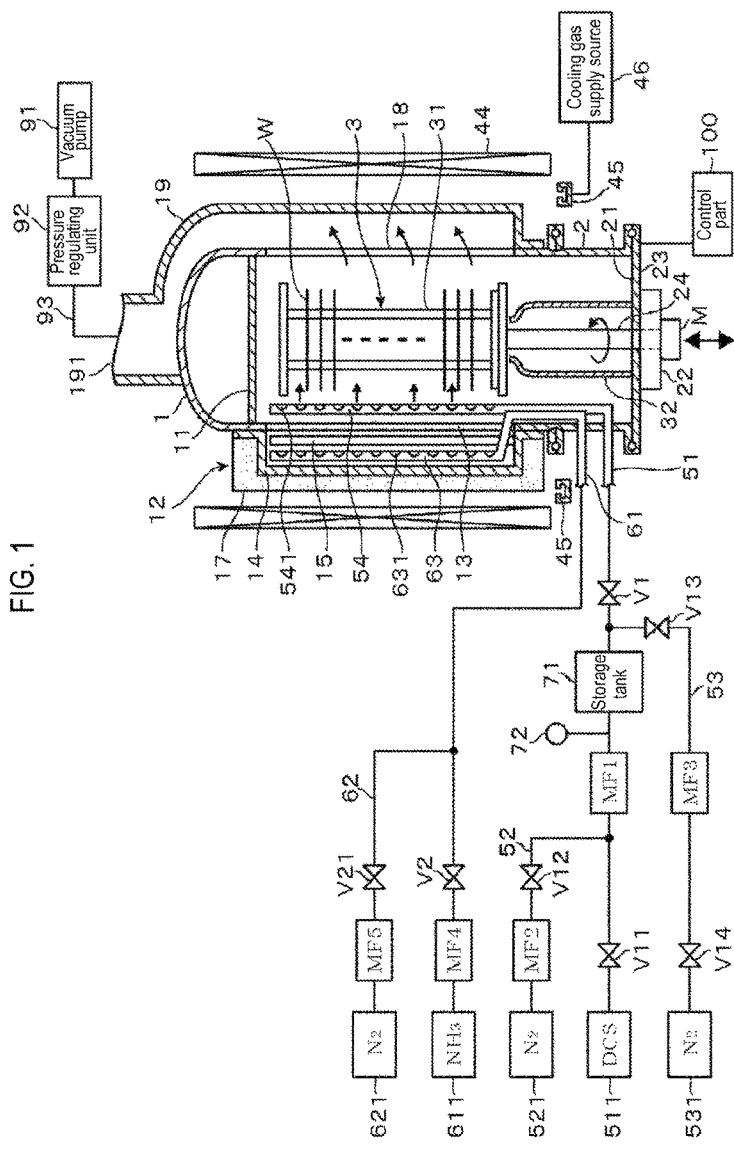
FIG. 1 is a longitudinal-sectional view showing an example of a vertical heat treatment apparatus according to the present disclosure.
Figure 2:
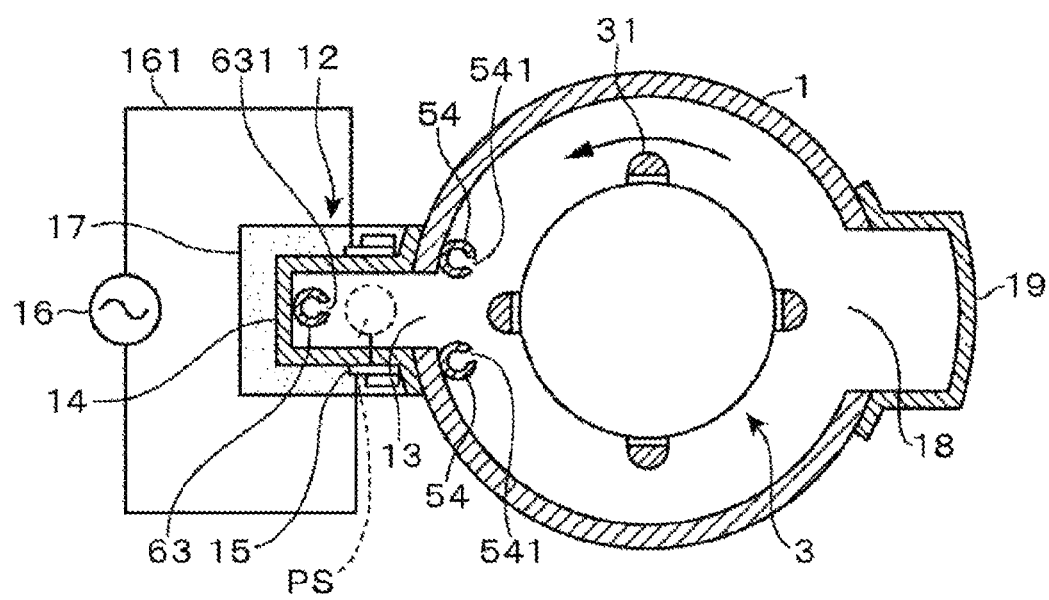
FIG. 2 is a cross-sectional view showing an example of a vertical heat treatment apparatus.

A vertical heat treatment apparatus according to an embodiment of the present disclosure will now be described in detail with reference to FIGS. 1 and 2. In FIGS. 1 and 2, a reaction container 2 is formed as a vertical cylindrical shape which is made by, for example, quartz. The upper part within the reaction container 1 is sealed by a ceiling plate 11 which is made by, for example, quartz. Also, the lower part is connected to a manifold 2 formed as a cylindrical shape which is made by, for example, stainless steel. The lower part of the manifold 2 is opened as a substrate carrying in/out hole 21 and tightly closed by a cover 23 made by, for example, quartz, which is installed at a boat elevator 22. A rotating shaft 24 is installed to pass through the center of the cover 23. The upper part of the rotating shaft 24 includes a wafer boat 3 which is a substrate holder.

Figure 3:
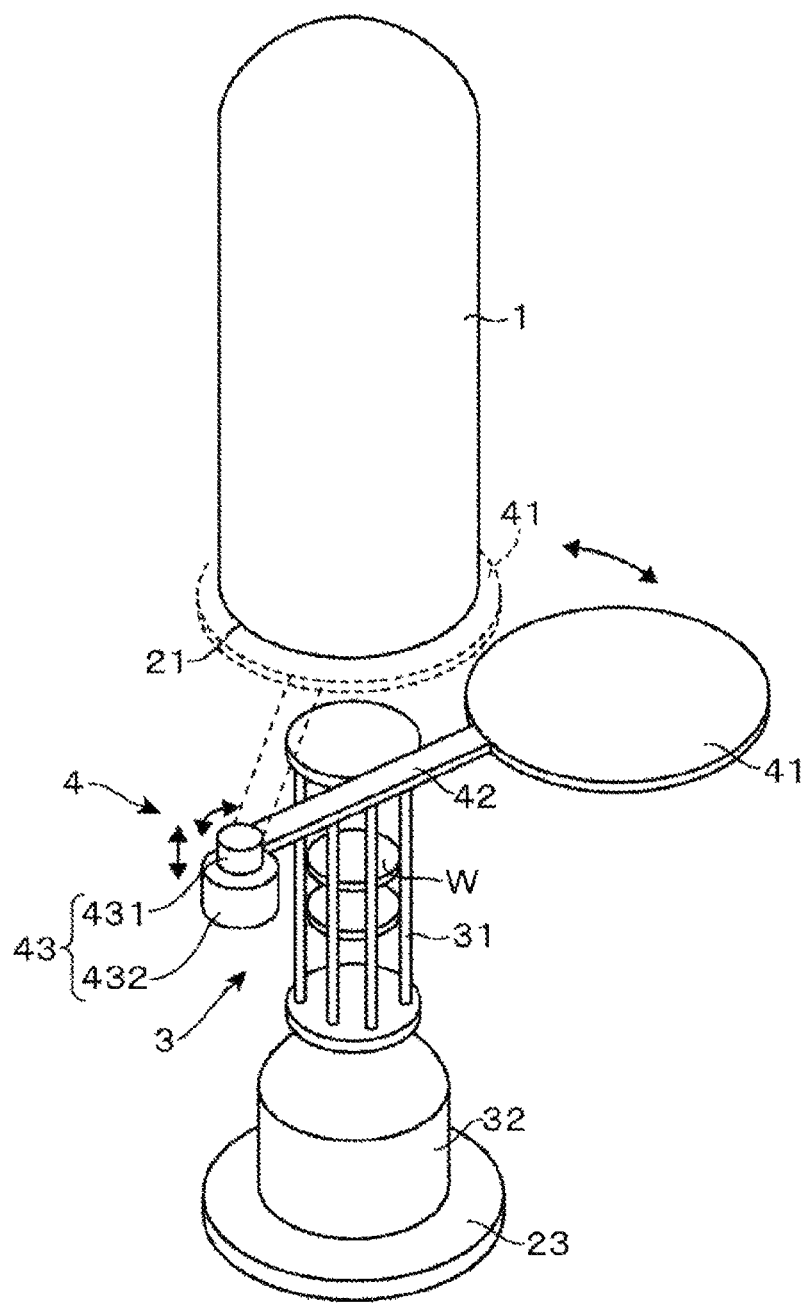
FIG. 3 is an oblique view showing a part of a vertical heat treatment apparatus.

As shown in FIG. 3, the wafer boat 3 includes, for example, four substrate holders 31 and supports an outer boundary part of a wafer W. Thus, the wafer boat 3 may hold a plurality of wafers W, for example 125 wafers, in a shelf shape. In FIG. 3, an insulation unit 32 is illustrated. The boat elevator 22 is configured to be elevated by an elevating mechanism which is not shown. The rotating shaft 24 is configured to be rotated about a vertical axis by a motor M which is included in a driving unit (not shown). Thus, the wafer boat 3 is configured to be loaded into the reaction container 1. Then, the wafer boat 3 is configured to be moved between a spot where the cover 23 closes the substrate carrying in/out hole 21 of the reaction container 1 and an unloading spot (shown in FIG. 3) at the lower part of the reaction container 1. The unloading spot is where the wafer boat 3 is in a moving mounting area of the wafer W, which is formed within a loading area (not shown).

A vertical heat treatment apparatus includes a cover 41 configured to close the substrate carrying in/out hole 21 of the reaction container 1 when the wafer boat 3 is unloaded from the reaction container 1, as shown in FIG. 3. The cover 41 is made by, for example, stainless steel and connected to an opening/closing mechanism 4. In addition, the opening/closing mechanism 4 includes a support member 42 configured to support the cover 41 and a moving mechanism 43 configured to move the cover 41 between a spot of closing the substrate carrying in/out hole and a spot of opening the substrate carrying in/out hole. The spot of opening substrate carrying in/out hole 21 is located, in this embodiment, in the side direction of the substrate carrying in/out hole 21 and acts as a standby position. The moving mechanism 43 combines an elevating mechanism 431 configured to support elevating, for example, a base of the support member 42 and a rotating mechanism 432 configured to rotate the elevating mechanism about the vertical axis.

A plasma generation unit 12 is installed at a part of a sidewall of the reaction container 1. The plasma generation unit 12 is formed by covering the sidewall of the reaction container 1 with a thin and long opening portion formed in upward and downward directions and air-tightly bonding a partitioning wall 14 which is made of, for example, quartz to an outer wall of the reaction container 1. In this embodiment, the partitioning wall 14 has a cross section being concave shaped. The opening portion 13 configured to cover all the wafers W supported by the wafer boat 3 is formed at length in upward and downward directions. In addition, a pair of plasma electrodes 15 opposing each other is installed along the direction of the length (upward and downward directions) at the outer side surface of both side walls of the partitioning wall 14. A high frequency power supply for plasma generation 16 is connected to the plasma electrode 15 with a power supply line 161 in between. Plasma can be generated by applying a high frequency voltage of, for example, 13.56 MHz, to the plasma electrodes 15. In addition, at the outer side of the partitioning wall 14, an insulation protection cover 17 made of, for example, quartz is installed to cover the partitioning wall 14.

In the region of the reaction container 1 facing the plasma generation unit 12, a long and thin exhaust hole 18 is formed in upward and downward directions, to vacuum exhaust the atmosphere within the reaction container 1. At the exhaust hole 18, an exhaust cover member 19 is installed to cover the exhaust hole 18 and has a cross section made of, for example, quartz and formed in a reverse C-shape. The exhaust cover member 19 configured to cover an upper side of the reaction container 1 is extended towards upward and downward directions, for example, along the side wall of the reaction container 1. A gas outlet 191 is formed, for example, at a floor side of the exhaust cover member 19. An exhaust pipe 93 having a vacuum pump 91 and a pressure regulating unit 92 forming a vacuum exhaust means are connected to the gas outlet 191. In addition, as shown in FIG. 1, a cylindrical body shaped heater 44 is installed, which is a heating unit and surrounds an outer circumference of the reaction container 1. A ring shaped gas transfer port 45 is installed, for example, between the reaction container 1 and the heater 44, and a cooling gas is transferred from a cooling gas supply source 46 to the gas transfer port 45.

A dichlorosilane supply route 51 configured to supply a silane-based gas, for example, a dichlorosilane (DCS: $SiH_2Cl_2$) gas, is inserted to a side wall of the manifold 2. At a leading end portion of the dichlorosilane supply route 51, for example, two first gas nozzles (54) configured to extend the inside of the reaction container 1 towards an upward direction are installed. The first gas nozzle 54 is formed with, for example, a quartz tube, and is placed between the plasma generation unit 12 and the opening portion 13. At the first gas nozzle 54, a plurality of gas discharge holes 541 are formed along the length direction of the first gas nozzle 54 at predetermined intervals. A dichlorosilane gas corresponds to the first gas as a source gas, and the dichlorosilane supply route 51 corresponds to an upper region of a gas supply route of the first gas nozzle 54.

In addition, an ammonia supply route 61 configured to supply an ammonia ($NH_3$) gas is inserted to the side wall of the manifold 2. At the leading end portion of the ammonia supply route 61, a second nozzle 63 formed with, for example, a quartz tube is installed, as shown in FIG. 2. The second gas nozzle 63 is extended towards an upward direction of the inside of the reaction container 1 and curved en route to be placed in the plasma generation unit 12, and a plurality of gas discharge holes 631 are formed along the length direction of the second gas nozzle 63 at predetermined intervals. An ammonia gas corresponds to a second gas as a reaction gas reacting with the molecules of the source gas and generating reaction products.

In the following, a gas supply system will be explained. One end portion of the dichlorosilane supply route 51 is connected to a dichlorosilane supply unit 511. At the dichlorosilane supply route 51, a valve V1, a storage tank 71 forming a storage unit, a pressure detection unit 72, a flow rate control unit MF1 and a valve V11 are installed, in the order from the reaction container 1. In addition, the dichlorosilane supply route 51 is branched out between the flow rate control unit MF1 and the valve V11 and is connected to a supply source of nitrogen gas as a purge gas 521 (or, a supply source of a purge gas), through a valve V12 and a purge gas supply route 52 having a flow rate control unit MF2. In addition, the dichlorosilane supply route 51 is connected to a supply source of nitrogen gas 531 which is an exchange gas, through an exchange gas supply route 53 which is branched out between the valve V1 and the storage tank 7. At the exchange gas supply route 53, a valve V13, a flow rate control unit MF3 and a valve V14 are installed in the order from the reaction container 1. The above valves and flow rate control units perform a gas supply/cut off and a control of a quantity of a gas supply, respectively, and the same will be applied to the following valves and flow rate control units.

When the valve V1 at a lower region of the storage tank 71 is closed and a gas is supplied to the storage tank 71, the gas is stored within the storage tank 71. Thus, the storage tank 71 is formed to have an increased pressure, by continuing to supply the gas to the storage tank 71. The storage tank 71 is made of, for example, stainless steel. In addition, the storage tank 71 with, for example, the pressure endurance performance, for example, 93.3 kPa and the capacity of one liter is used.

One end portion of the ammonia supply route 61 is connected to an ammonia gas supply unit 611. At the ammonia supply route 61, a valve V2 and a flow rate control unit MF4 are installed, in the order from the reaction container 1. In addition, the ammonia supply route 61 is branched out from a lower region side of the valve V2 and is connected to a supply source of nitrogen gas 621 which is an exchange gas, through an exchange gas supply route 62 having a valve V21 and a flow rate control unit MF5.

The vertical heat treatment apparatus having the above-described configuration is connected to a control part 100, as shown in FIG. 1. The control part 100 includes, for example, a CPU which is not shown and a computer having a memory unit. In the memory unit, there is recorded a program configured for a step (command) group regarding a function of the vertical heat treatment apparatus, that is, a control when performing a film forming processing on a wafer W in the reaction container 1 and a control when purging the inside of the reaction container 1. The program is stored at a storage medium, for example, a hard disk, a compact disk, a magnetic optical disk and a memory card, etc. and is installed to a computer from the storage medium.

Figure 5A:
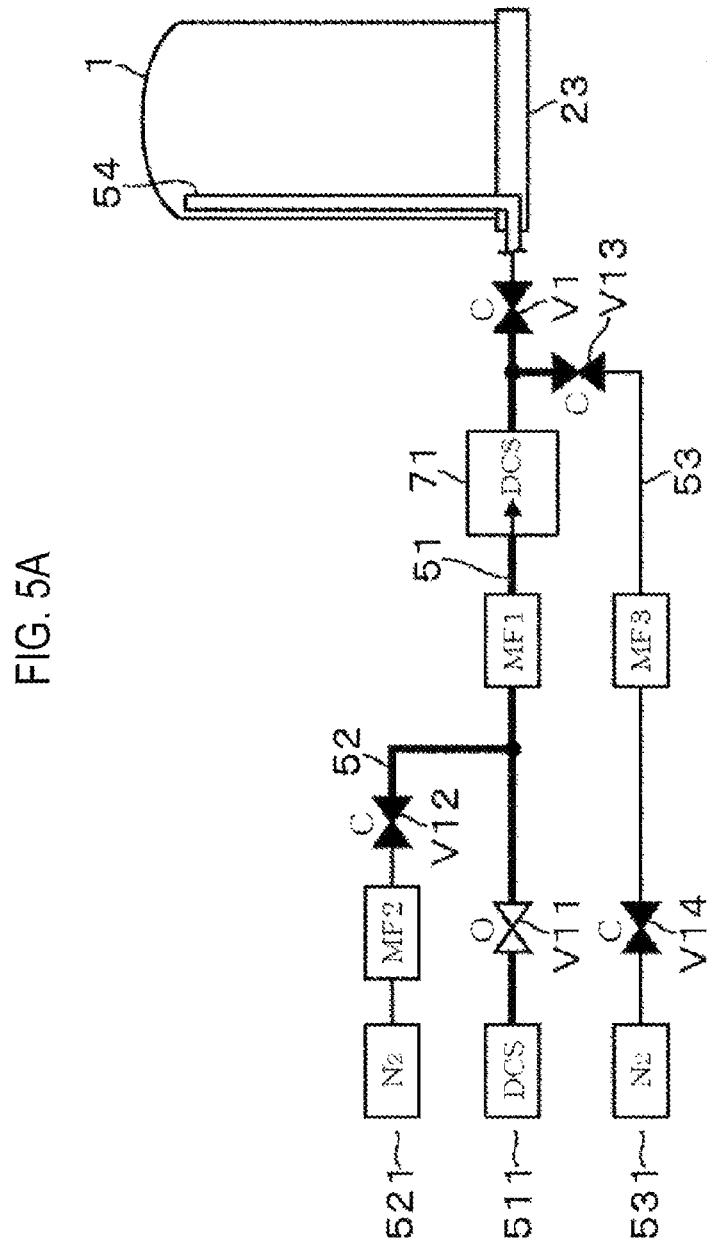
FIGS. 5A to 5C are block diagrams showing a film forming process performed at a vertical heat treatment apparatus.

In succession, a driving method of the vertical heat treatment apparatus will be described in reference to FIGS. 4 to 7. The driving method of the apparatus includes a loading process of a wafer W into the reaction container 1, a film forming process forming a thin film on the wafer W and a purge process supplying a purge gas into the reaction container 1. After loading the wafer boat 3 into the reaction container 1, the film forming process is performed. In the film forming process, the vacuum pump 91 creates a vacuum atmosphere about 13.33 Pa (0.1 Torr) inside the reaction container, and a dichlorosilane gas which is the source gas (the first gas) is supplied into the reaction container 1 in the case the wafer boat 3 is rotated. In this time, a dichlorosilane gas is stored in the storage tank 71, pressurized and discharged to the reaction container 1. Specifically, as shown in FIG. 5A, the valve V1 is closed and the valve V11 is opened, at the dichlorosilane supply route 51. In addition, the valve V12 of the purge gas supply route 52, the valves V13 and V14 of the exchange gas supply route 53, the valve V2 of the ammonia supply route 61 and the valve V21 of the exchange gas supply route 62 are closed, respectively. As mentioned above, a dichlorosilane gas is supplied to the storage tank 71 at a predetermined flux, for example 2000 sccm, and is charged within the storage tank 71. In addition, for FIGS. 5A to 5B and FIGS. 7A and 7B, an opened one among the valves is denoted by "O" and represented in a white color, and a closed one is denoted by "C" and represented by a black color.

The supply of a dichlorosilane gas causes the pressure of the storage tank 71 to increase gradually. Then, the pressure within the storage tank 71 is raised to a first pressure which is, for example, from 33.33 kPa (250 Torr) to 53.33 kPa (400 Torr), and the valve V11 is closed. Accordingly, an upper region of the valve V1 at the dichlorosilane supply route 51, a flow path from the upper region of the valve V1 to a lower region of the valve V12 of the purge gas supply route 52 and a flow path from the upper region of the valve V1 to a lower region of the valve V13 of the exchange gas supply route 53 are filled by a dichlorosilane gas, respectively.

Figure 5B:
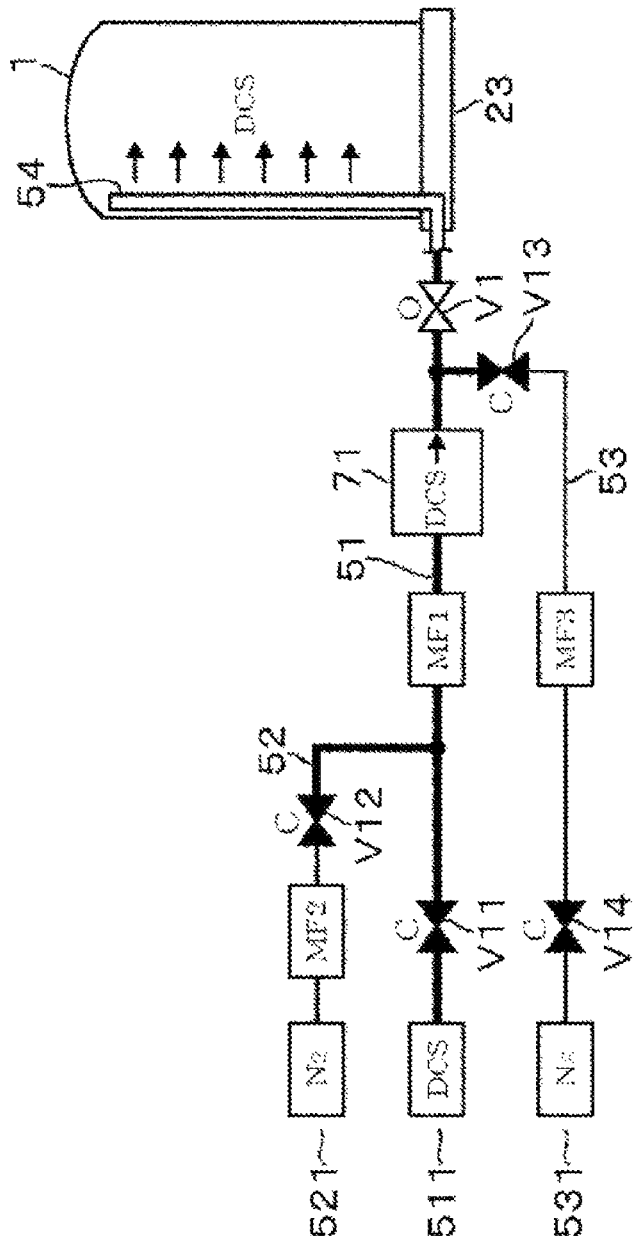

In succession, as shown in FIG. 5B, the dichlorosilane gas in the storage tank 71 is discharged into the reaction container 1 by opening the valve V1. Because a vacuum atmosphere is set within the reaction container 1, the dichlorosilane gas is released rapidly from the storage tank 71 when the valve V1 is opened. Then, the dichlorosilane gas flows at a predetermined flow speed in the first gas nozzle and is discharged into the reaction container 1 through the discharge hole 541. In the reaction container 1, the dichlorosilane gas flows to the exhaust hole 18 and is discharged to the outside through a gas outlet 191. The first gas nozzle 54 and the exhaust hole 18 are formed to be located opposite to each other in between a wafer W. Thus, the dichlorosilane gas flows on a surface of the wafer W from one side to the other side, and the molecules of the dichlorosilane gas are absorbed to the surface of the wafer W.

Figure 5C:
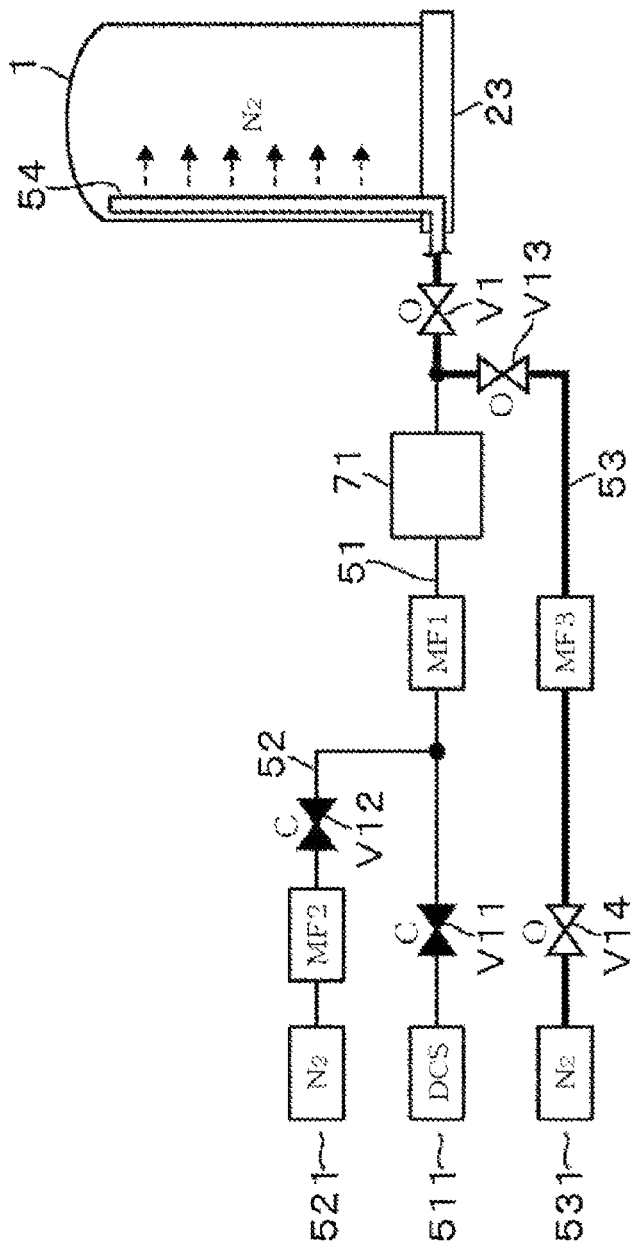

Thus, after a whole dichlorosilane gas within the storage tank 71 is discharged, the nitrogen 621 gas as the exchange gas is supplied into the reaction container and purges the inside of the reaction container 1. In this process, as shown in FIG. 5C, the valve V1 of the dichlorosilane supply route 51 and the valves V13 and V14 of the exchange gas supply route 53 are opened, while the other valves V11, V12, V2 and V21 are closed. Then, the nitrogen gas as the exchange gas is supplied to the reaction container 1 through the first gas nozzle 54 for a predetermined time, thereby exchanging the dichlorosilane gas in the reaction container 1 with the nitrogen gas.

Thereafter, the ammonia gas as a reaction gas (the second gas) is supplied into the reaction container 1. In this process, by opening the valve V2 of the ammonia supply route 61 and the valve V21 of the exchange gas supply route 62, the ammonia gas and the nitrogen gas are supplied into the reaction container 1 through the second gas nozzle 63, with the high frequency power supply in the "ON" state. The other valves V1, V11, V12, V13 and V14 are closed. Accordingly, at the plasma generation unit 12, the plasma is generated in the region PS represented by a dotted line in FIG. 2, and active species, for example, N radical, NH radical, $NH_2$ radical and $NH_3$ radical, etc. are generated and absorbed on the surface of the wafer W. On the surface of the wafer W, the molecules of the dichlorosilane gas react with the active species of $NH_3$, thereby forming a thin film of a silicon nitride film (a SiN film). Then, the supply of ammonia gas is stopped by closing the valve V2. The nitrogen gas is continuously supplied from the second gas nozzle 63 into the reaction container 1, thereby exchanging the ammonia gas in the reaction container 1 with the nitrogen gas. By repeating this series of this process, each thin film of a SiN film is stacked as one layer on the surface of the wafer W, forming a SiN film with a desired thickness on the surface of the wafer W. The temperature inside the reaction container 1 at this film forming process is, for example, 500 degrees C.

In this example, the supply quantity and the supply time for a dichlorosilane gas are set to make the pressure in the storage tank 71 become the first pressure at a predetermined time when charging the storage tank 71 with the dichlorosilane gas. For example, while having the supply quantity being constant, the pressure in the storage tank 71 is set to the first pressure at a predetermined time by controlling the supply time of the dichlorosilane gas. Then, based on the supply time, the opening/closing of the valves V1 and V11 are controlled. In addition, when a dichlorosilane gas is supplied from the storage tank 71 into the reaction container 1, the time from opening the valve V1 to discharging a whole dichlorosilane gas in the storage tank 71 is known in advance. Based on the supply time, the opening/closing of the valves V13 and V14 configured to supply the exchange gas (nitrogen gas) are controlled. The expression "the whole dichlorosilane gas in the storage tank 71 is discharged" means that the pressure inside the storage tank 71 becomes almost equal to the pressure inside the reaction container 1 (for example, 1.33 Pa (0.01 Torr)).

The thin film process is performed as mentioned above. Then, the temperature in the reaction container 1 is set to, for example, 500 degrees C.; the valves, for example, V1, V13, V14 and V21 are opened and the other valves are closed; the nitrogen gas is supplied to the reaction container 1 through, for example, the exchange gas supply routes 53 and 62; and thus, the pressure in the reaction container 1 is returned to an atmospheric pressure. Then, the wafer boat 3 is unloaded, and the substrate carrying in/out hole 21 of the reaction container 1 is blocked by the cover 41. That is, the cover 41 at a stand-by position is rotationally moved to a lower side of the substrate carrying in/out hole 21 by the rotating mechanism 432 of the opening/closing mechanism 4. Subsequently, the cover 41 is elevated to a position blocking the substrate carrying in/out hole 21 by the elevating mechanism 431, thereby air-tightly blocking the substrate carrying in/out hole 21.

Then, a purge process of the reaction container 1 is performed. Due to the already described film forming process, a thin film is attached to an inner wall of the reaction container 1 or a surface of the first gas nozzle 54, etc. Thus, the purge process is performed to peel off and forcibly remove the thin film by supplying the purge gas into the reaction container 1. At first, the inside of the reaction container 1 is vacuumed by the vacuum pump 91 and set to a predetermined vacuum atmosphere of, for example, 1.33 Pa (0.01 Torr). In addition, as shown in FIG. 6, the temperature of the inside of the reaction container 1, at the same time with the initiation of vacuuming the reaction container 1, is raised from 500 degrees C. to the temperature of the purge process, for example, 800 degrees C. The reaction container maintains the temperature of 800 degrees C., for example, for 20 minutes. Then, the temperature of the reaction container 1 is lowered rapidly from 800 degrees C. to 200 degrees C., by supplying, for example, air at the room temperature to the gas transfer port 45 from the cooling gas supply source 46.

Figure 7A:
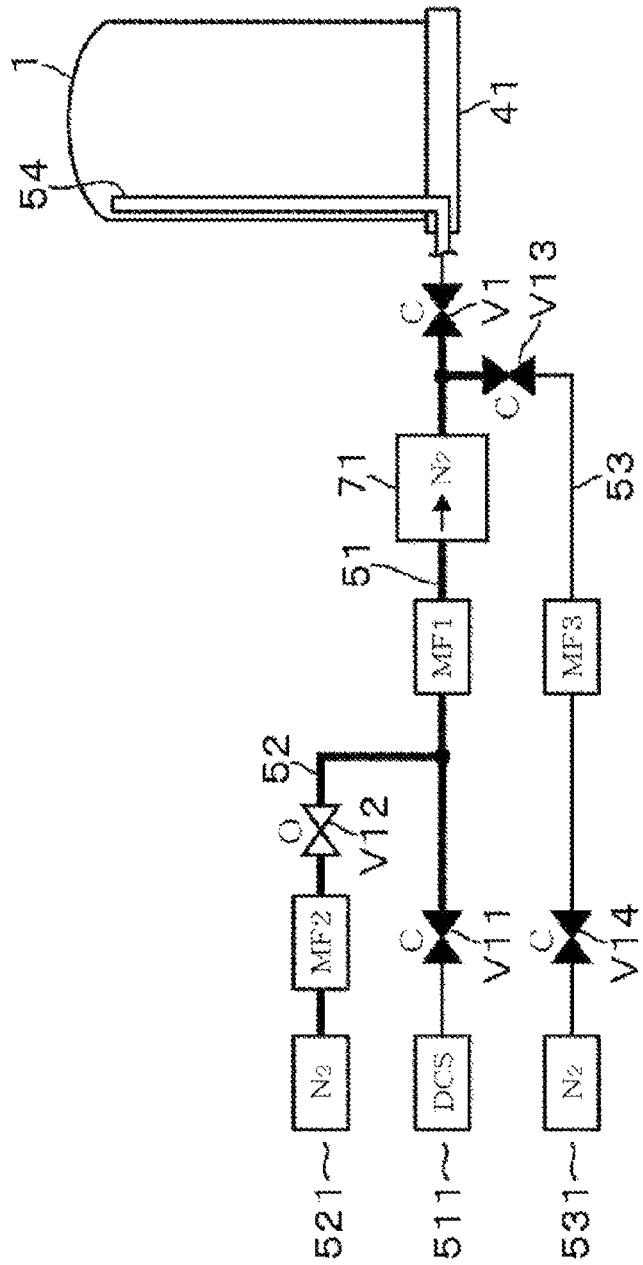
FIGS. 7A and 7B are block diagrams showing a fuzzy process performed at a vertical heat treatment apparatus.

At the timing of lowering the temperature of the reaction container 1, the nitrogen gas as the purge gas is supplied into the reaction container 1. In the supply of the purge gas, as shown in FIG. 7A, the valve V12 is opened, and the other valves V1, V11, V13, V14, V2 and V21 are closed. As described above, the purge gas is supplied to the storage tank 71 at a predetermined flux of, for example, 2000 sccm through the purge gas supply route 52 and the dichlorosilane supply route 51, thereby charging the storage tank 71. By the supply of the purge gas, the pressure of the storage tank 71 gradually increases. Then, the pressure inside the storage tank 71 is raised to a second pressure which is higher than the first pressure, and the valve V12 is closed. Accordingly, a flow path at the dichlorosilane supply route 51 from the upper region of the valve V1 to a lower region of the valve V11, a flow path from the upper region of the valve V1 to the purge gas supply source 521 at the purge gas supply route 52 and a flow path from the upper region of the valve V1 to a lower region of the valve V13 of the exchange gas supply route 53 are filled by the purge gas, respectively.

The second pressure is higher than the pressure of the storage tank 71 when the storage tank 71 is pressurized by a dichlorosilane gas. If the pressure of the storage tank 71 is pressurized too heavily, the pressure in the reaction container 1 is increased when the purge gas is supplied into the reaction container 1, as described later. When the purge gas is supplied, the pressure in the reaction container 1 is, specifically, less than 1.33 kPa (10 Torr), and in this regard, the second pressure is set, specifically, from 53.33 kPa (400 Torr) to 93.33 kPa (700 Torr).

Figure 7B:
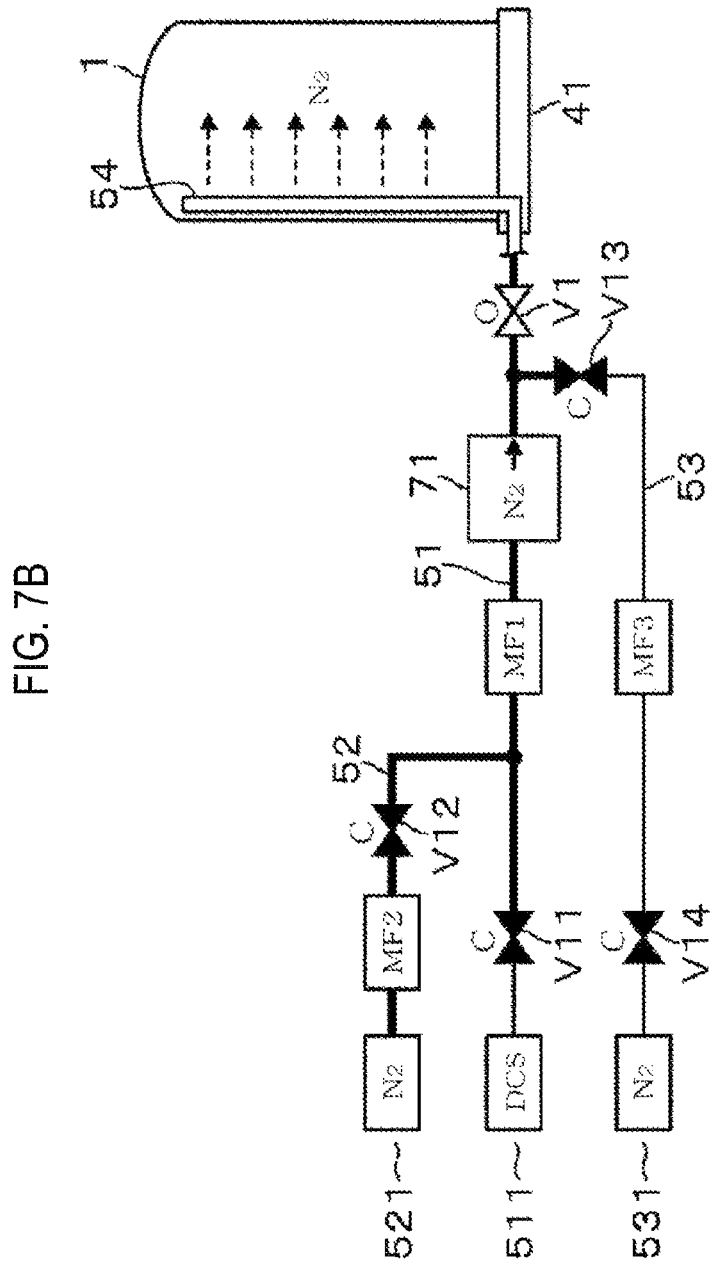

In continuation, as shown in FIG. 7B, the purge gas in the storage tank 71 is discharged by opening the valve V1. Because the reaction container 1 is set to have a vacuum atmosphere, the purge gas in the storage tank 71 is discharged rapidly and flows to the first gas nozzle 54, after opening the valve V1. Then, the purge gas flows in the first gas nozzle 54 at a predetermined flow speed and is discharged into the reaction container 1 through the discharge hole 541. The purge gas is discharged to the outside through the exhaust hole 18 and the gas outlet 191. In charging the storage tank with the purge gas, the pressure in the storage tank 71 is higher than the pressure when charging the storage tank 71 with a dichlorosilane gas. Thus, the purge gas flows at a higher flow speed into the first gas nozzle than the dichlorosilane gas.

As described above, if the temperature of the reaction container 1 is raised to 800 degrees C. and then lowered to 200 degrees C., the reaction container 1 and the first gas nozzle 54 which are formed of quartz experience the difference in thermal contraction with a thin film attached to quartz and the reaction container 1, etc. Thus, the stress caused at the thin film generates a crack on the reaction container 1 or the first gas nozzle 54. The purge gas is introduced at the timing of lowering the reaction container 1. Thus, the purge gas collides with a thin film having a crack and peels off the thin film, which is discharged to the outside through the exhaust hole 18. In this time, the purge gas is pressurized in the storage tank 71. Thus, the purge gas under a high pressure is discharged to the reaction container 1 through the first gas nozzle 54. Accordingly, the purge gas flows with a high flow speed at a flow path of the purge gas at the lower region of the storage tank 71. Thus, the existing particles or reaction products are removed by this flow. By performing the purge process as described above, a thin film attached to the inner wall of the reaction container 1 or the surface of the first gas nozzle 54 is removed, and the particle existing at the inside of the dichlorosilane supply route 51 or the first gas nozzle 54 is also removed.

As described above, after the whole purge gas in the storage tank 71 is discharged, the valve V1 is closed and the valve V12 is opened. Again, as shown in FIG. 7A, the purge gas is charged to the storage tank 71. Then, when the pressure in the storage tank 71 becomes the second pressure again, the valve V12 is closed and the valve V1 is opened as shown in FIG. 7B, and the purging is performed by discharging the purge gas to the reaction container 1. The purge process is performed by repeating, for example more than 50 times, the pressurizing the purge gas in the storage tank 71 and the discharging of the gas to the reaction container 1. The higher number of repetition of the purge process is better, but the throughput will be decreased when the purge process is repeated too many times. Thus, the number of repetition of the purge process is determined by considering a moving mounting time for the wafer W onto the wafer boat 3.

FIG. 6 is a characteristic view briefly describing the relationship between temperature and time in the reaction container 1 and the relationship between pressure and time in the storage tank 71, respectively. In this example, the pressure in the storage tank 71 is raised to 79.99 kPa (600 Torr) by closing the valve V1 and supplying the purge gas into the storage tank 71. Then, the pressure in the storage tank 71 is lowered to 1.33 Pa (0.01 Torr) by opening the valve V1. If the pressure in the storage tank 71 is raised to 79.99 kPa and then the purge gas is supplied to the reaction container 1, the pressure in the reaction container 1 is raised to, for example, 0.51 kPa (3.8 Torr). In the purge process, for example, the pressurizing and discharging of the purge gas are performed 50 times. Because the pressure in the storage tank 71 and the pressure in the dichlorosilane supply route 51 in which the pressure detection unit 72 is installed are almost identical, both pressures are referred to herein the pressure in the storage tank 71.

In this example, when charging the purge gas to the storage tank 71, the supply quantity and the supply time for the purge gas to the storage tank 71 are set, respectively, in order to make the pressure in the storage tank 71 become the second pressure at a predetermined time. Based on the supply time, the opening/closing of the valves V1 and V12 are controlled, respectively. In addition, when discharging the purge gas to the reaction container 1 from the storage tank 71, the supply time of the purge gas to the reaction container 1 until the whole purge gas in the storage tank 71 is discharged is known in advance. Based on the supply time, the opening/closing of the valves V1 and V12 are controlled, respectively. The expression "the whole purge gas in the storage tank 71 is discharged" means that the pressure in the storage tank 71 becomes almost same as the pressure in the reaction container 1. In addition, the pressure in the storage tank 71 when charging the purge gas to the storage tank 71 is properly set by considering the pressure endurance performance of the storage tank 71, etc. or the supply quantity and the supply time for the purge gas.

During the purge process performed in the reaction container 1, as described above, the wafer boat 3 is unloaded and placed at a carrying in/out position. As shown in FIG. 4, a moving mounting mechanism 8 performs the receiving of the wafer W of which the film forming process is completed and the transfer of the unprocessed wafer W for the wafer boat 3. After the purge process is completed, the temperature in the reaction container 1 is set to the temperature during the film forming process. The valves, for example, V1, V13, V14 and V21 are opened and the other valves are closed, and the nitrogen gas is supplied to the reaction container 1 through, for example, the exchange gas supply routes 53 and 62. Thus, the pressure in the reaction container 1 is returned to an atmospheric pressure. Thereafter, the cover 41 is opened and placed at the stand-by position. Then, the wafer boat 3 having the unprocessed wafer W is loaded into the reaction container 1, and the next film forming process is performed, which is the same as described.

In the described embodiment, the opening/closing of the valve are not controlled based on a detection value of the pressure detection unit 72. Thus, strictly speaking, there is a case in which the dichlorosilane gas or the purge gas is discharged before the pressure in the storage tank 71 becomes the first or the second pressure. In this case, the valve V1 is closed and a gas is charged before the dichlorosilane gas or the purge gas in the storage tank 71 is discharged entirely. However, the source gas may be quickly absorbed to the entire area of a wafer, by pressurizing the gas in the storage tank 71 of which the pressure is higher than the dichlorosilane gas, and discharging the gas in the storage tank 71. In addition, a bigger purge effect may be obtained by pressurizing the storage tank 71 with the purge gas which is discharged. Accordingly, although the target pressure in the storage tank 71 is the first or the second pressure, if the pressure is not over the first or the second pressure in reality, the present disclosure includes the case when the valve V1 is opened, the valve V1 is closed before the gas in the storage tank 71 is not discharged entirely.

According to the above-mentioned embodiment, the particle pollution of the wafer W can be reduced. As described above, the inventor figured out that particles are attached to the wafer W when the dichlorosilane gas is discharged at a first time, in case of performing the film forming process during alternatively performing the step of pressurizing the dichlorosilane gas in the storage tank 71 and supplying the gas to the wafer W, and the step of supplying the ammonia gas to the wafer W. Thus, it is assumed that the particles are poured out from the silane-based gas supply routes, the dichlorosilane supply route 51 and the first gas nozzle 54.

Thus, before performing the film forming process at the first time, a process in which the purge gas is stored and pressurized in the storage tank 71 and discharged repeatedly is added. After the purge gas is stored and pressurized in the storage tank 71 and discharged, the purge gas is rapidly discharged and flows with a high flow speed to the dichlorosilane supply route 51 and the first gas nozzle 54. Thus, at a flow path of the dichlorosilane gas at the lower region of the storage tank 71, the purge gas flows with the particles existing at the flow path due to the strong flow. The particles are discharged to the reaction container 1. On the other hand, the purge process configured to forcibly peel off a thin film attached to the inside of the reaction container 1 is performed. By using the timing of the particles existing, the purge process is performed to exhaust and remove the particles from a peeled off thin film caused in the reaction container 1 and the particles which are flowed from the flow path of the dichlorosilane gas.

The driving method of the present disclosure is performed in reality to confirm the existence of the particles. In the purge process, the temperature of the reaction container 1 is raised to 800 degrees C. and then lowered to 200 degrees C. In lowering the temperature, a process is repeated for 50 times, in which the purge gas is stored at the storage tank 71, pressurized to 79.99 kPa (600 Torr) and supplied to the reaction container 1. Subsequently, the wafer boat 3 with a dummy wafer installed is loaded into the reaction container 1, and the dichlorosilane gas at the first time of the film forming process is supplied. By confirming the surface of the dummy wafer with a SEM (Scanning Electron Microscope), it is not found that the particles are attached on a line along the direction of a diameter of the wafer.

In addition, the present disclosure repeats for a plurality of times a process of storing the purge gas in the storage tank 71, pressurizing the gas and then discharging the gas to the reaction container 1 by opening the valve V1 at the lower region of the storage tank 71. Thus, a pressure variation is increased when supplying the purge gas to the flow path of the dichlorosilane gas and the reaction container 1. It becomes easier for moving particles and peeling a thin film of the reaction container 1 off, thereby removing the particles reliably. In addition, the purge process is performed when unloading the wafer boat 3 from the reaction container 1 and moving the mounted processed and unprocessed wafers for the wafer boat 3. Thus, the purge process can be performed in parallel with removing the particles and moving the mounted wafer W concurrently, thereby restraining a decrease of the throughput.

In addition, the pressure in the storage tank 71 when supplying the purge gas is increased more than the pressure in the storage tank 71 when supplying the dichlorosilane gas. Then, the purge gas is supplied to the reaction container 1.

In this time, the purge gas flows in the first gas nozzle 54 with a higher flow speed than the flow speed at a filming forming. As the flow speed of the flowing gas is higher, the effect of removing the particle in a gas flow path, such as the first gas nozzle 54, etc. is improved, thereby reliably removing the particles at the lower region of the storage tank 71 by a through flow of the purge gas. Thus, in performing the film forming process after the purge process, the particles carried with the dichlorosilane gas by the through flow of the dichlorosilane gas do not exist anymore, even though the dichlorosilane gas is supplied after being pressurized in the storage tank 71. Thus, the particle pollution can reliably be restrained.

In addition, the process of storing the purge gas in the storage tank 71, pressurizing the gas and discharging the gas to the reaction container 1 may be performed after performing a cleaning of the reaction container 1, as well as in between the film forming processes. The cleaning is performed by, for example, a vacuum exhaust of the reaction container 1 and a cleaning gas supplied from a cleaning gas nozzle. As a cleaning gas, a fluorine-based gas, for example, a fluoro-chlorine gas (a $ClF_3$ gas) is used. In some cases, after cleaning the reaction container 1, a cleaning gas or a residue of the cleaning process is stuck within the first gas nozzle 54 or the second gas nozzle 63. However, by performing the above-described purge process after the cleaning process, a cleaning gas, etc. remained in the gas nozzles 54 and 63 can be exhausted by a through flow of the purge gas. Thus, by performing a process in the order of the cleaning process, the purge process and the film forming process, it is restrained that a cleaning gas is mixed with a source gas, etc. in the gas nozzle, when the source gas or the reaction gas is supplied in the film forming process. In this case, the cleaning gas or the residue of the cleaning process remained in the second gas nozzle 63 can be removed by installing a storage tank at the ammonia supply route 61, storing the purge gas in the storage tank, pressurizing the gas and discharging the gas to the reaction container 1 through the ammonia supply route 61 and the second gas nozzle 63.

In the above, the process of storing the purge gas in the storage tank, pressurizing the gas and discharging the gas to the reaction container 1 by opening the valve V1 at the lower region of the storage tank 71 may be performed at a timing of raising the temperature of the reaction container 1 or maintaining the temperature of the reaction container 1 at a high temperature, as well as at a timing of lowering the temperature of the reaction container 1 in the purge process. By performing the process at these timings, the particles can be removed by the through flow of the purge gas in the flow path of the dichlorosilane gas at the lower region of the storage tank 71.

In addition, the pressure when storing the purge gas in the storage tank 71 and pressurizing the gas does not need to be higher than the pressure of the dichlorosilane gas when the gas is pressurized in the film forming process. It is allowed that the pressure of the purge gas pressurized and that of the pressurized dichlorosilane gas are equal. This is because, also in this case, the particles can be removed by the through flow of the purge gas in the flow path of the dichlorosilane gas at the lower region of the storage tank 71. In addition, in the purge process, the nitrogen gas as the purge gas may be discharged to the reaction container 1 both from the dichlorosilane supply route 51 and the ammonia supply route 61. In addition, in the process of raising the temperature of the reaction container 1, the ammonia gas may be discharged to the reaction container 1 from the ammonia supply route 61.

In addition, the dichlorosilane gas and the purge gas may be supplied to the reaction container 1 by opening/closing the valve V1 based on a detection value of the pressure in the storage tank 71 detected by the pressure detection unit 72. In this case, if the pressure in the storage tank 71, for example, reaches a predetermined upper limit value, the valve V1 between the storage tank 71 and the reaction container 1 is opened to discharge the gas to the reaction container 1. Due to the discharge of the gas from the storage tank 71, the pressure in the storage tank 71 is lowered to reach a predetermined lower limit value. Then, the valve V1 is closed and controlled to pressurize the gas in the storage tank 71 to the upper limit value again.

In addition, in the above-described embodiment, the purge gas (nitrogen gas) is supplied to the storage tank 71 through the dichlorosilane supply route 51, respectively. However, the purge gas may be supplied directly to the storage tank 71, not through the dichlorosilane supply route 51. Also in this case, the particles are removed by the through flow of the purge gas in the flow path at the lower region of the storage tank 71, thereby restraining the particle pollution of the wafer W. In addition, a portion of a gas supply route may be the storage unit 71 without using a tank, and the pressure in the storage unit 71 may be increased by opening/closing of the valve V1 at the upper and lower regions of the storage unit 71. In addition, without forming the exchange gas supply route 53, the nitrogen gas as the exchange gas may be supplied to the reaction container 1 through the purge gas supply route 52 and the dichlorosilane supply route 51. In addition, after unloading the wafer boat 3 holding the processed wafer W from the reaction container 1, the purge process may be performed by unloading the processed wafer W from the wafer boat 3 and then loading the vacant wafer boat 3 into the reaction container 1. In this case, the purge process is performed under the condition that the substrate carrying in/out hole 21 of the reaction container 1 is closed by the cover 23 installed at the boat elevator 22.

In addition, without installing the storage tank 71 at the dichlorosilane supply route 51, the storage tank 71 may be installed at the purge gas supply route 52 connected to the dichlorosilane supply route 51. In this case, a first valve is installed between the storage tank and a purge gas supply unit at the purge gas supply route 52, and a second valve is installed at a lower region of the storage tank 71. In addition, a third valve is installed at a lower region of a connecting part between the dichlorosilane supply route 51 and the purge gas supply route 52. When the dichlorosilane gas is stored at the storage tank 71, the first valve at the upper region of the storage tank 71 and the third valve at the dichlorosilane supply route 51 are closed and the second valve at the lower region of the storage tank 71 is opened. The dichlorosilane gas is stored at the storage tank 71 from the dichlorosilane supply route 51 through the purge gas supply route 52 and pressurized. In this way, the inside of the storage tank 71 is pressurized to a predetermined pressure, and the dichlorosilane gas is discharged to the first gas nozzle by opening the third valve. In addition, when the purge gas is stored at the storage tank 71, the first valve at the upper region of the storage tank 71 is opened, the second valve at the lower region of the storage tank 71 and the third valve at the dichlorosilane supply route 51 are closed, and the purge gas is stored at the storage tank 71 and pressurized. After pressurizing the inside of the storage tank 71 to a predetermined pressure, the purge gas is discharged to the first gas nozzle by opening the second and the third valves.

In the above, a silane-based gas may be BTBAS ((bistertiary-butylamino) silane), HCD (hexa-dichloro silane) and 3DMAS (trisdimethylamino silan), etc., other than a dichlorosilane gas. In addition, an inert gas such as argon gas, etc. may be used for a purge gas and an exchange gas, other than the nitrogen gas.

Besides, in the vertical heat treatment apparatus of the present disclosure, a titanium chloride ($TiCl_4$) gas, for example, may be used as the source gas (the first gas) and the ammonia gas may be used as the reaction gas (the second gas), thereby forming a titanium nitride (TiN) film. In addition, for the source gas, TMA (trimethylammonium) may be used.

In addition, the reaction for acquiring a desired thin film by the reaction of the source gas absorbed onto the surface of the wafer W may use various reactions including an oxidation reaction using, for example, $O_2$, $O_3$ and $H_2O$, etc., a reduction reaction using organic acids, $H_2$, HCOOH and $CH_3COOH$, etc. and alcohols, $CH_3OH$ and $C_2H_5OH$, etc., a carbonization reaction using $CH_4$, $C_2H_6$, $C_2H_4$ and $C_2H_2$, etc. and a nitration reaction using $NH_3$, $NH_2NH_2$ and $N_2$, etc.

In addition, three or four kinds of reaction gases may be used for reaction gases. For an example of using three kinds of reaction gases, there is a film forming for strontium titanate ($SrTiO_3$), by using, for example, $Sr(THD)_2$ (strontiumbistetramethylheptandionate) as a source of Sr, $Ti(OiPr)_2(THD)_2$ (titaniumbisisopropoxidebistetramethylheptandionate) as a source of Ti and ozone gas as an oxidation gas of these materials. In this case, the gas is converted in the order from a Sr source gas, an exchange gas, an oxidation gas, an exchange gas, a Ti source gas, an exchange gas, an oxidation gas and an exchange gas.

The present disclosure figures out that the particle pollution of the substrate occurs when the source gas is discharged at a first time, in case of performing the film forming process by performing the step of pressurizing the source gas in the storage unit and supplying the gas to the substrate and the step of supplying the reaction gas to the substrate, alternatingly. In this process, before loading the substrate to the reaction container, a process is added and repeated, in which the purge gas is stored and pressurized in the storage unit and discharged. On the other hand, while exchanging the processed substrate with the unprocessed substrate, the purge process is performed to forcibly peel off a thin film attached to the inside of the reaction container. By performing the above-described process at this timing, the particles caused in the reaction container are exhausted. Thus, as confirmed by the experimental result, the particle pollution is reduced.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A driving method of a vertical heat treatment apparatus having a vertical reaction container with a heating part installed on the periphery of the vertical reaction container, a first gas nozzle configured to supply a first gas as a source gas, a second gas nozzle configured to supply a second gas as a reaction gas which generates reaction products by reacting with molecules of the source gas, and a cleaning gas nozzle configured to supply a cleaning gas, comprising:

performing a process of loading a plurality of wafers held in a shelf shape by a substrate holder support to the reaction container;

performing a film forming process of storing the first gas at a storage unit installed at a gas supply route at an upper region of the first gas nozzle and pressurizing the first gas, and alternatively performing a step of supplying the first gas to the reaction container under vacuum atmosphere by opening a valve at a lower region of the storage unit and a step of supplying the second gas to the reaction container from the second gas nozzle;

performing a cleaning process of performing a vacuum exhaust of the reaction container and supplying the cleaning gas to the reaction container from the cleaning gas nozzle;

unloading the substrate holder support holding the substrate from the reaction container, and closing a substrate carrying in/out hole of the reaction container;

performing a purge process of raising a temperature of the reaction container to a predetermined temperature and lowering the temperature of the reaction container such that a crack is generated in a thin film attached to the reaction container, the crack being caused due to a difference in thermal contraction between the thin film attached to the reaction container and a material forming the reaction container, and supplying a purge gas into the reaction container when the temperature of the reaction container is lowered such that the purge gas collides with the thin film having the crack to forcibly peel off the thin film attached to the reaction container, wherein the purge process is performed after the cleaning process; and performing a process, while the purge process is performed, of repeating an operation controlling the valve a plurality of times in storing the purge gas at the storage unit, pressurizing the purge gas and discharging the purge gas into the reaction container by opening a valve at a lower region of the storage unit, wherein the cleaning gas is a fluorine-based gas and the purge gas is an inert gas, wherein the film forming process is performed after the process of repeating the operation controlling the valve a plurality of times to discharge the purge gas into the reaction container, and wherein a pressure of the purge gas stored and pressurized at the storage unit is higher than a pressure of the first gas pressurized in the film forming process such that a flow speed of the purge gas, while the purge process is performed, is higher than a flow speed of the first gas, while the film forming process is performed.

2. The method of claim 1, wherein the first gas is a silane-based gas.

* * * * *